US007269808B2

(12) United States Patent  
Bruce et al.

(10) Patent No.: US 7,269,808 B2
(45) Date of Patent: Sep. 11, 2007

(54) DESIGN VERIFICATION

(75) Inventors: James A. Bruce, Williston, VT (US);
James A. Culp, Downington, PA (US);
John D. Nickel, Westford, VT (US);
Jacek G. Smolinski, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 188 days.

(21) Appl. No.: 10/908,786

(22) Filed: May 26, 2005

(65) Prior Publication Data
US 2006/0270268 A1 Nov. 30, 2006

(51) Int. Cl.
*G06F 17/50* (2006.01)
(52) U.S. Cl. .................. 716/5; 716/2; 716/18
(58) Field of Classification Search .............. 716/2, 716/4–6, 18
See application file for complete search history.

(56) References Cited

U.S. PATENT DOCUMENTS

| | | | | |
|---|---|---|---|---|
| 6,031,986 | A * | 2/2000 | Milsom | ....................... 703/14 |
| 6,240,375 | B1 * | 5/2001 | Sonoda | ........................ 703/14 |
| 6,415,421 | B2 | 7/2002 | Anderson et al. | |
| 6,425,113 | B1 | 7/2002 | Anderson et al. | |
| 6,532,439 | B2 * | 3/2003 | Anderson et al. | ............. 703/14 |
| 6,544,699 | B1 | 4/2003 | Kim et al. | |
| 6,622,289 | B2 * | 9/2003 | Saunders et al. | .............. 716/4 |
| 6,941,530 | B2 * | 9/2005 | Joshi et al. | .................... 716/4 |
| 2003/0237064 | A1 | 12/2003 | White et al. | |

* cited by examiner

*Primary Examiner*—Jack Chiang
*Assistant Examiner*—Binh Tat
(74) *Attorney, Agent, or Firm*—Schmeiser, Olsen & Watts; Richard M. Kotulak

(57) ABSTRACT

A design verification method, including (a) providing in a design a design electrically conducting line and a design contact region being in direct physical contact with the design electrically conducting line; (b) modeling a simulated electrically conducting line of the design electrically conducting line; (c) simulating a possible contact region of the design contact region, wherein the design contact region and the possible contact region are not identical; and (d) determining that the design electrically conducting line and the design contact region are potentially defective if an interfacing surface area of the simulated electrically conducting line and the possible contact region is less than a pre-specified value.

17 Claims, 4 Drawing Sheets

DESIGN VERIFICATION

BACKGROUND OF THE INVENTION

1. Technical Field

The present invention relates to design verification, and more specifically, to semiconductor device design verification.

2. Related Art

In a semiconductor device design, a design structure (i.e., a structure in the design) and the same structure in actuality (i.e., after being fabricated according to the design) are always not identical. More specifically, the design structure and the same structure in actuality may have different shapes, sizes, and/or positions on the wafer. For example, in the design, a metal line can be on top of and in direct physical contact with a via, while, in actuality, the metal line can be misaligned with the via such that the metal line is not in direct physical contact with the via. When this happens (i.e., in actuality, the metal line is not in direct physical contact with the via), the entire chip that contains the metal line and the via can be defective and may have to be discarded.

As a result, there is a need for a method for identifying potential defects in a design (called a design verification process) due to structures in actuality and the same structure in design not having the same shapes, sizes, or positions on the wafer.

SUMMARY OF THE INVENTION

The present invention provides a design verification method, comprising providing in a design a design electrically conducting line and a design contact region being in direct physical contact with the design electrically conducting line; modeling a simulated electrically conducting line of the design electrically conducting line; simulating a possible contact region of the design contact region, wherein the design contact region and the possible contact region are not identical; and determining that the design electrically conducting line and the design contact region are potentially defective if an interfacing surface area of the simulated electrically conducting line and the possible contact region is less than a pre-specified value.

The present invention also provides a design verification method, comprising providing in a design a design electrically conducting line and a design contact region being in direct physical contact with the design electrically conducting line; modeling a simulated electrically conducting line of the design electrically conducting line; simulating M different possible contact regions of the design contact region, M being an integer greater than 1; identifying a common region of the M possible contact regions; and determining that the design electrically conducting line and the design contact region are potentially defective if an interfacing surface area of the common region and the simulated electrically conducting line is less than a pre-specified value.

The present invention also provides a computer program product, comprising a computer usable medium having a computer readable program code embodied therein, said computer readable program code comprising an algorithm adapted to implement a method for design verification, said method comprising providing in a design a design electrically conducting line and a design contact region being in direct physical contact with the design electrically conducting line; modeling a simulated electrically conducting line of the design electrically conducting line; simulating a possible contact region of the design contact region, wherein the design contact region and the possible contact region are not identical; and determining that the design electrically conducting line and the design contact region are potentially defective if an interfacing surface area of the simulated electrically conducting line and the possible contact region is less than a pre-specified value.

The present invention also provides a method for identifying potential defects in a design due to structures in actuality and the same structure in design not having the same shapes, sizes, or positions on the wafer.

DETAILED DESCRIPTION OF THE INVENTION

Figure 1A:
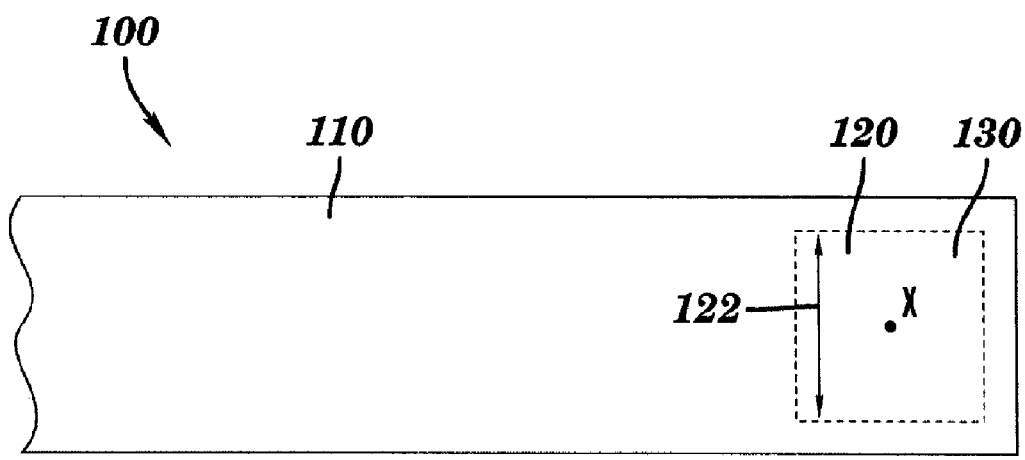
FIGS. 1A-1B illustrate top-down views of an electrically conducting line and a contact region in design and in actuality, respectively, in accordance with embodiments of the present invention.

FIG. 1A illustrates a top-down view of a design structure 100 in a design, in accordance with embodiments of the present invention. The design structure 100 can comprise a design electrically conducting (e.g., metal) line 110 and a design contact region (e.g., a via) 120. The design contact region 120 can have a rectangle shape with four sharp corners (as opposed to round corners). The design electrically conducting line 110 can also have sharp corners and can be on top of and in direct physical contact with the contact region 120. In current designs, 90 degree corners are almost always used, although occasionally 45 degree lines are used. The contact region 120 can be used to electrically couple the electrically conducting line 110 to devices (not shown).

As seen in FIG. 1A, the design electrically conducting line 110 has a good electrical contact with the design contact region 120 because the interfacing surface 130 between the design electrically conducting line 110 and the design contact region 120 has a maximum area.

Figure 1B:
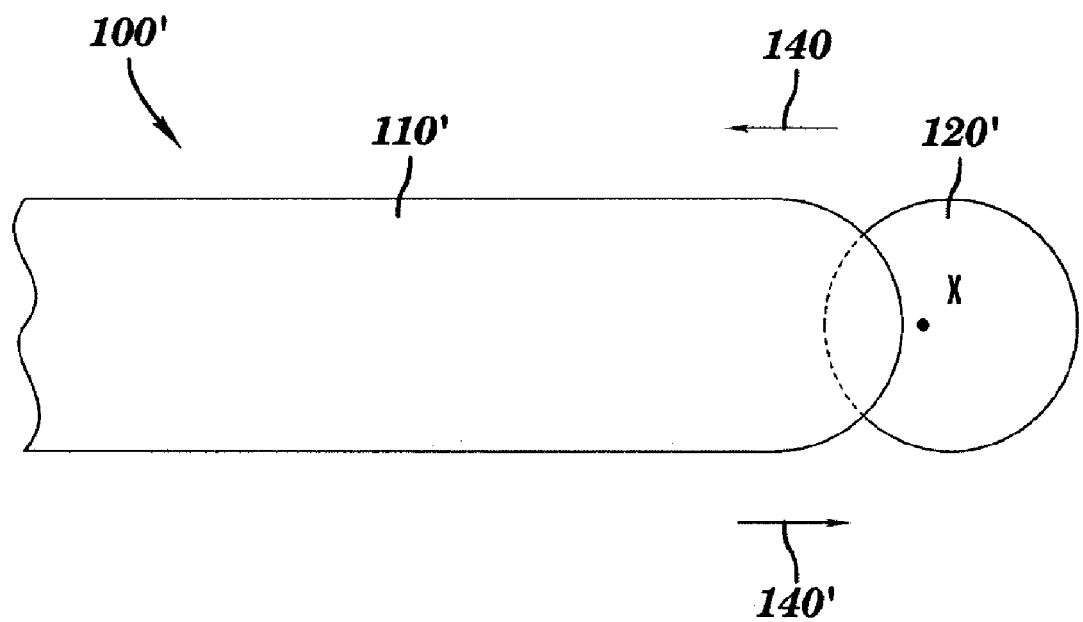

FIG. 1B illustrates a top-down view of an actual structure 100' (i.e., in actuality) fabricated according to the design structure 100 of FIG. 1A, in accordance with embodiments of the present invention. The actual structure 100' can comprise an actual electrically conducting line 110' and an actual contact region 120' fabricated according to the design electrically conducting line 110 and the design contact region 120 of FIG. 1A, respectively.

Different from the design electrically conducting line 110 (FIG. 1A), the actual electrically conducting line 110' will have round corners. A point X is present in both FIGS. 1A and 1B to show how the actual structure 100' is displaced from the design structure 100 (FIG. 1A). As can be seen in FIG. 1B, the line end of the actual electrically conducting line 110' is displaced in direction 140 (i.e., to the left) with respect to the line end of the design electrically conducting line 110 (FIG. 1A).

Similarly, different from the design contact region 120 (FIG. 1A), the actual contact region 120' can have four round corners. This makes the actual contact region 120' look like a circle when viewed top-down. In addition, the actual contact region 120' can be larger (in size) than the design contact region 120 (FIG. 1A). Moreover, the position of the actual contact region 120' can be displaced in direction 140' (i.e., to the right) with respect to the design contact region 120 (FIG. 1A). In general, the actual contact region 120' can be larger or smaller (in size) than the design contact region 120 (FIG. 1A), and the position of the actual contact region 120' can be displaced in any direction (not just the direction 140) with respect to the design contact region 120 (FIG. 1A). In short, there can be a difference in size, shape, and/or position between design (FIG. 1A) and actuality (FIG. 1B).

It should be noted that if the design structure 100 of FIG. 1A is fabricated multiple times, the resultant actual structures will be different from the design and will be different from each other in terms of size, shape, and position. This is because it is impossible to have exactly the same fabrication process for forming the actual structures. Each time the design structure 100 of FIG. 1A is fabricated, the temperature, the pressure, the gas flow, etc will be different (though small) regardless of efforts are made to make sure the same fabrication process is used for each time the design structure 100 of FIG. 1A is fabricated. As a result, some actual structures can be larger than design, while others can be smaller than design. Some actual structures can be displaced in one direction with respect to design, while others can be displaced in another direction. The actual structures can have different shapes.

Basically, the present invention creates (i.e., simulating, modeling, not actually fabricating) different possible forms of the actual structure of the design structure 100 (FIG. 1A) without actual fabrication. Then, these possible forms of the actual structure are in turn (i.e., one after another) examined for defects. If at least one of these possible forms of the actual structure constitutes a defect, then the design structure can be considered potentially defective and can be redesigned using any conventional method. For example, the design electrically conducting line 110 (FIG. 1A) can be redesigned to be thicker in a direction perpendicular to the view of FIG. 1A than before so that, when fabricated, the actual electrically conducting line 110' (FIG. 1B) would extend further in the direction 140' (i.e., to the right) and hence would have a larger electrical contact with the contact region 120' (FIG. 1B).

Figure 2A:
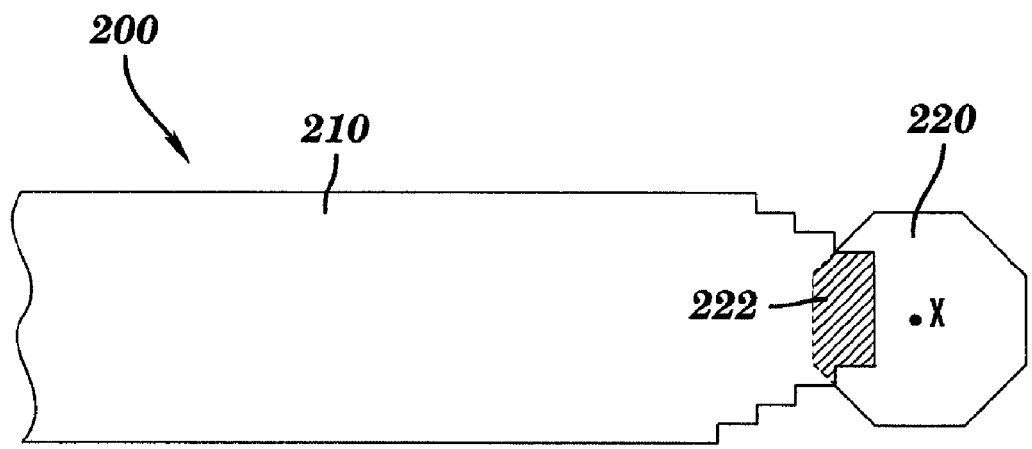
FIGS. 2-4 illustrate top-down views of possible forms of the electrically conducting line and the contact region of FIG. 1A, in accordance with embodiments of the present invention.
Figure 3A:
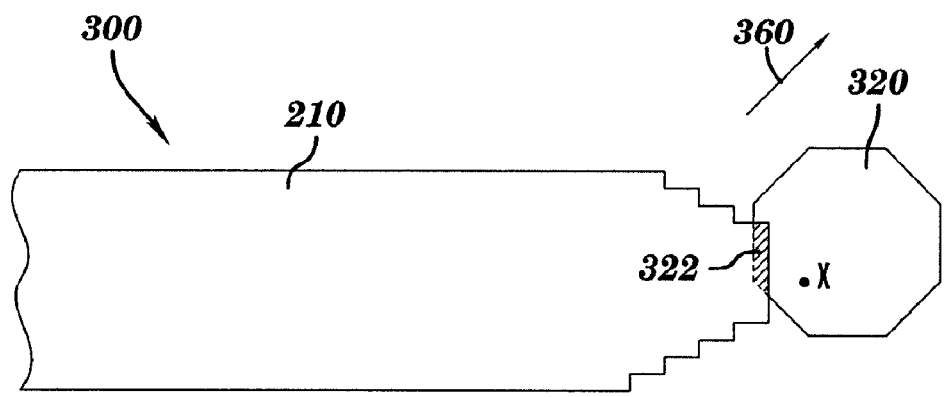
Figure 3B:
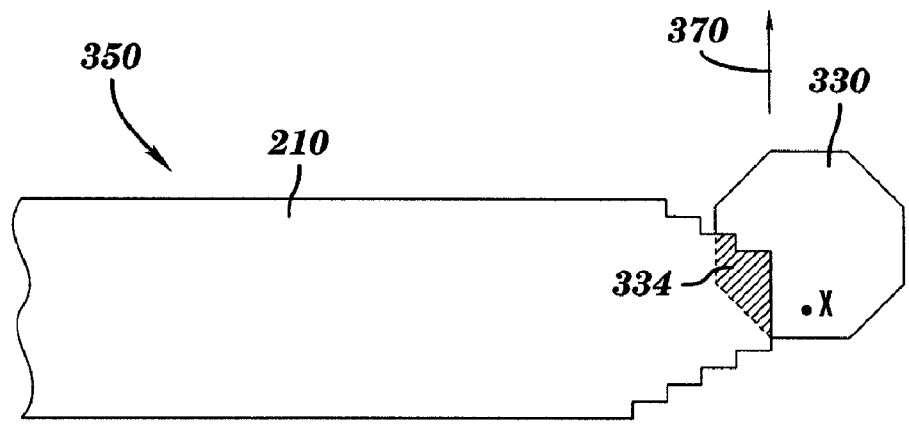
Figure 4:
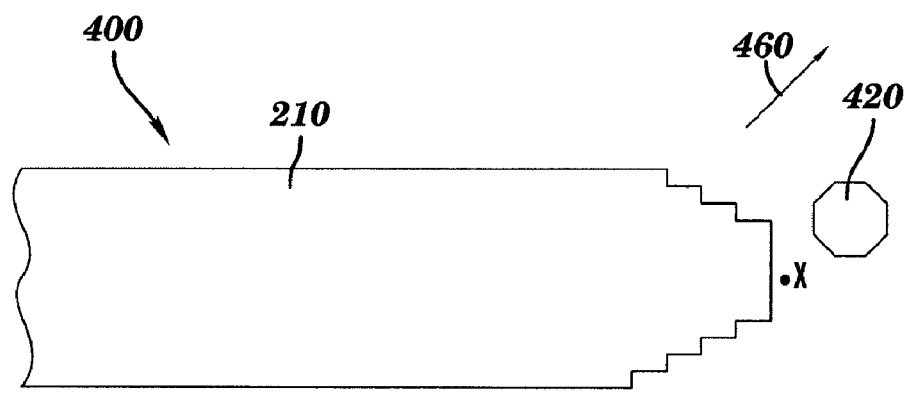

FIGS. 2-4 illustrate top-down views of different possible forms of the actual structure of the design structure 100 (FIG. 1A). More specifically, with reference to FIG. 2A, the possible structure 200 can comprise a simulated electrically conducting line 210 and a possible contact region 220. In one embodiment, the simulated electrically conducting line 210 can be obtained by running a conventional computer simulation program. The possible contact region 220 can be obtained by cutting the corners (i.e., changing the shape) of the design contact region 120 (FIG. 1A). In other words, the contact region 220 can have an octagon shape when viewed top-down. In general, any shape (e.g., polygon, circle, etc.) can be used as a possible shape of the actual structure of the rectangle design contact region 120 (FIG. 1A).

The simulated electrically conducting line 210 and the possible contact region 220 has an interfacing surface 222 which determines the quality of the electrical contact between the simulated electrically conducting line 210 and the possible contact region 220. In one embodiment, if the interfacing surface 222 has an area less than a pre-specified value, then the possible structure 200 can be considered defective. As a result, the design structure 100 can be considered likely to fail (i.e., potentially defective) and can be redesigned using any conventional method.

In one embodiment, the pre-specified value is determined based on (a) the maximum design current expected to flow between the design electrically conducting line 110 and the design contact region 120 of FIG. 1A and (b) the maximum allowable current density that can flow through an interfacing surface between the design electrically conducting line 110 and the design contact region 120 (FIG. 1A) without damaging the electric contact between the design electrically conducting line 110 and the design contact region 120 (FIG. 1A).

For example, assume that the maximum design current expected to flow between the design electrically conducting line 110 and the design contact region 120 (FIG. 1A) is 10 $\mu A$ and that the maximum allowable current density that can flow through the interfacing surface 130 (FIG. 1A) without damaging the electric contact between the design electrically conducting line 110 and the design contact region 120 (FIG. 1A) is 2 $\mu A/\mu m2$. Then, the pre-specified value can be calculated as follows: $10\,\mu A/(2\,\mu A/\mu m2)=5\,\mu m2$. As a result, if the interfacing surface 222 has an area less than 5 $\mu m2$, the current density that flows through the interfacing surface 222 can exceed the maximum allowable current density (2 $\mu A/\mu m2$) and can destroy the electric contact between the simulated electrically conducting line 210 and the possible contact region 220. As a result, the design structure 100 can be considered likely to fail (i.e., potentially defective) and can be redesigned using any conventional method.

Figure 2B:
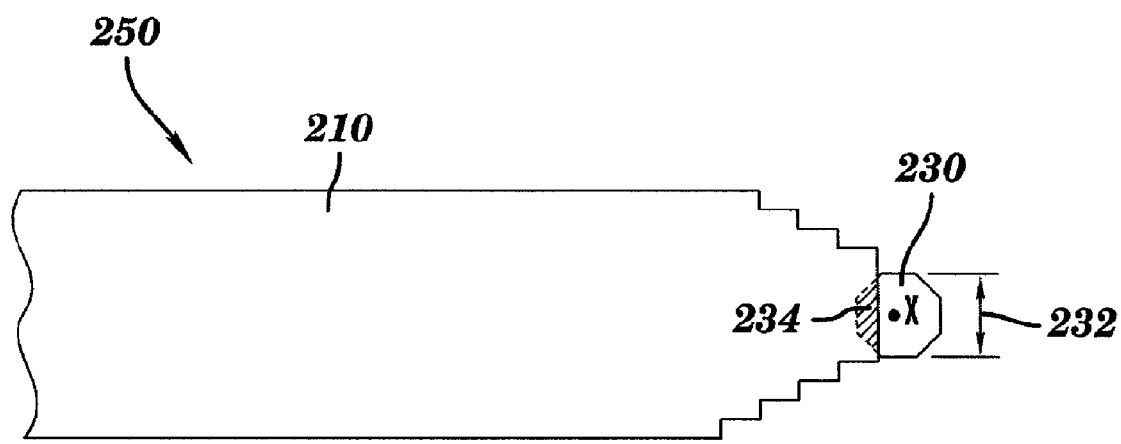

FIG. 2B shows another possible form (the possible structure 250) of the actual structure of the design structure 100 (FIG. 1A). The possible structure 250 is similar to the possible structure 200 (FIG. 2A) except that the possible contact region 230 is reduced in size. It can be observed that the smaller the size of the possible contact region 230, the smaller the interfacing surface 234. If the interfacing surface 234 has an area of less than the pre-specified value, then the possible structure 250 can be considered defective. As a result, the design structure 100 can be considered potentially defective and can be redesigned using any conventional method. In one embodiment, the possible contact region 230 can have a minimum size within a size tolerance of a fabrication process which will be used to fabricate the design structure 100 (FIG. 1A). The size tolerance can be specified as one-dimensional (linear) or two-dimensional (area). For example, assume that the fabrication process has a linear size tolerance of 60% (i.e., the actual linear size can be in the range of 40%-160% of the design linear size). As a result, the height 232 of the possible contact region 230 can be selected at 40% of the height 122 of the design contact region 120 (FIG. 1A). In one embodiment, with the possible contact region 230 being at its minimum size (i.e., a worst-case scenario in terms of size), if the interfacing surface 234 has an area of at least the pre-specified value, there is no need to create (i.e., simulating, modeling, not actually fabricating) more possible forms of the actual structure of the design structure 100 (FIG. 1A) having the same shape and position as that of the design contact region 220 (FIG. 2A).

FIG. 3A shows yet another possible form (the possible structure 300) of the actual structure of the design structure 100 (FIG. 1A). The possible structure 250 is similar to the possible structure 200 (FIG. 2A) except that the possible contact region 320 is displaced in the north-east direction 360. It can be observed that the interfacing surface 322 is smaller than the interfacing surface 222 (FIG. 2A). In one embodiment, if the interfacing surface 322 has an area of less than the pre-specified value, then the possible structure 300 can be considered defective. As a result, the design structure 100 can be considered potentially defective and can be redesigned using any conventional method.

FIG. 3B shows yet another possible form (the possible structure 350) of the actual structure of the design structure 100 (FIG. 1A). The possible structure 350 is similar to the possible structure 200 (FIG. 2A) except that the possible contact region 330 is displaced in the north direction 370. It can be observed that the interfacing surface 334 is smaller than the interfacing surface 222 (FIG. 2A) but larger than the interfacing surface 322 (FIG. 3A). In one embodiment, if the interfacing surface 334 has an area of less than the pre-specified value, then the possible structure 350 can be considered defective. As a result, the design structure 100 can be considered potentially defective and can be redesigned using any conventional method.

FIG. 4 shows yet another possible form (the possible structure 400) of the actual structure of the design structure 100 (FIG. 1A). The possible structure 400 is similar to the possible structure 200 (FIG. 2A) except that the possible contact region 420 is not only reduced in size but also displaced in the north-east direction 460. It can be observed that the simulated electrically conducting line 210 and the possible contact region 420 do not have an interfacing surface (or, in other words, have an interfacing surface that has an area of zero). In this case, the possible structure 400 can be considered defective. As a result, the design structure 100 can be considered potentially defective and can be redesigned using any conventional method.

In one embodiment, with reference to FIG. 1A, for the design structure 100, one possible form of the actual structure of the design structure 100 after another can be created (i.e., modeled or simulated) and examined until (a) a defect is found or (b) N possible forms of the actual structure have been created and examined but none is found defective (N is a pre-specified positive integer), whichever comes first. In one embodiment, situation (a) occurs if the possible form which is being examined has an interfacing surface with an area of less than the pre-specified value. Situation (b) occurs if all the N possible form have interfacing surfaces with areas at least the pre-specified value. When either (a) or (b) occurs, the verification of the design structure 100 can be considered complete. In an alternative embodiment, the verification of the design structure 100 continues until P (a pre-specified positive integer) possible forms of the actual structure are in turn created and examined. Then, all the defective cases (if any) are recorded and become the basis for re-design of the design structure 100. After the design structure 100 is verified, other design structures (not shown) other than the design structure 100 can be in turn verified in a similar manner.

In one embodiment, each possible form of the actual structure of the design structure 100 can be created by simulating the electrically conducting line 110 (resulting in the simulated electrically conducting line 210 in FIGS. 2-4) and changing the shape, size, and/or position of the contact region 120 (resulting in the possible contact regions 220, 230, 320, 330, and 420 in FIGS. 2A, 2B, 3A, 3B, and 4, respectively).

In one embodiment, the N possible forms of the actual structure can include worst-case scenarios. For example, FIG. 2B illustrates a worst case scenario in terms of size in which the size of the contact region 230 is minimum. To increase the chance of creating a possible form of the actual structure close to the worst-case scenario in terms of position, each possible contact region created can have a maximum displacement from the design within a displacement tolerance of the fabrication process which will be used to fabricate the design electrically conducting line and the design contact region.

In one embodiment described above, each of the N possible forms of the design contact region 120 (FIG. 1A) is in turn simulated (created) and its interfacing surface with the simulated electrically conducting line 210 is compared with the pre-specified value. Alternatively, all N possible forms of the design contact region 120 (FIG. 1A) are simulated (created) and superimposed on one another so as to identify a common region (not shown) that belongs to all the N possible forms of the design contact region 120 (FIG. 1A). Then, if the interfacing surface area between the common region and the simulated electrically conducting line 210 is less than the pre-specified value, the design structure 100 is considered potentially defective. If the interfacing surface area between the common region and the simulated electrically conducting line 210 is at least the pre-specified value, the design structure 100 is considered satisfactory.

In one embodiment, the creation, examination, and determination of failure of possible forms of the actual structure can be performed by a computer running a program.

Figure 5:
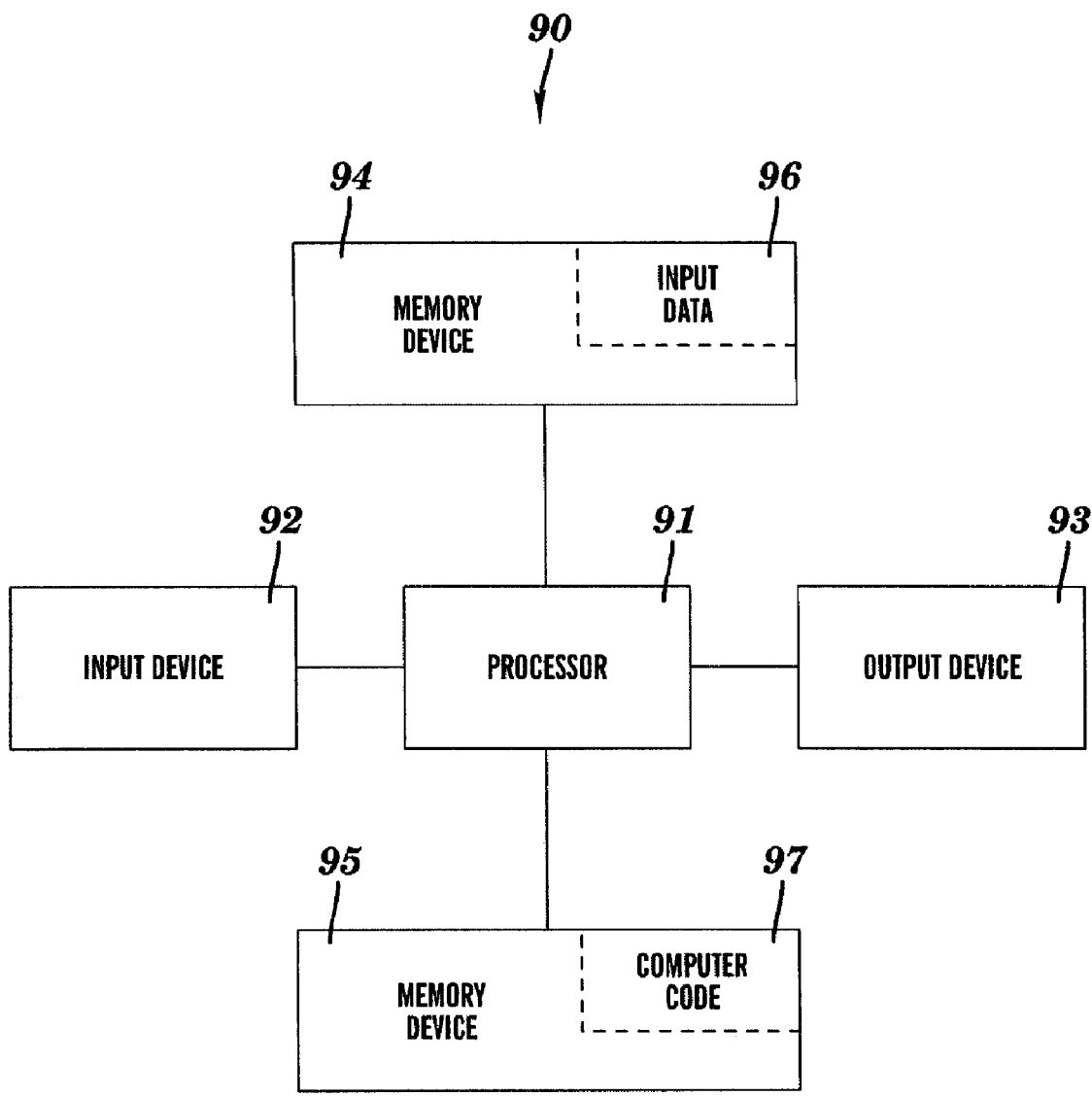
FIG. 5 illustrates a computer system used for design verification, in accordance with embodiments of the present invention.

FIG. 5 illustrates a computer system 90 used for design verification, in accordance with embodiments of the present invention. The computer system 90 comprises a processor 91, an input device 92 coupled to the processor 91, an output device 93 coupled to the processor 91, and memory devices 94 and 95 each coupled to the processor 91. The input device 92 may be, inter alia, a keyboard, a mouse, etc. The output device 93 may be, inter alia, a printer, a plotter, a computer screen, a magnetic tape, a removable hard disk, a floppy disk, etc. The memory devices 94 and 95 may be, inter alia, a hard disk, a floppy disk, a magnetic tape, an optical storage such as a compact disc (CD) or a digital video disc (DVD), a dynamic random access memory (DRAM), a read-only memory (ROM), etc. The memory device 95 includes a computer code 97. The computer code 97 includes an algorithm for design verification. The processor 91 executes the computer code 97. The memory device 94 includes input data 96. The input data 96 includes input required by the computer code 97. The output device 93 displays output from the computer code 97. Either or both memory devices 94 and 95 (or one or more additional memory devices not shown in FIG. 5) may be used as a computer usable medium (or a computer readable medium or a program storage device) having a computer readable program code embodied therein and/or having other data stored therein, wherein the computer readable program code comprises the computer code 97. Generally, a computer program product (or, alternatively, an article of manufacture) of the computer system 90 may comprise said computer usable medium (or said program storage device).

Thus the present invention discloses a process for deploying computing infrastructure, comprising integrating computer-readable code into the computer system 90, wherein the code in combination with the computer system 90 is capable of performing a method for design verification.

While FIG. 5 shows the computer system 90 as a particular configuration of hardware and software, any configuration of hardware and software, as would be known to a person of ordinary skill in the art, may be utilized for the purposes stated supra in conjunction with the particular computer system 90 of FIG. 5. For example, the memory devices 94 and 95 may be portions of a single memory device rather than separate memory devices.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. A design verification method, comprising:
   providing in a design a design electrically conductive line and a design electrically conductive contact region being in direct physical contact with the design electrically conductive line;
   modeling a simulated electrically conductive line of the design electrically conductive line;
   simulating a possible electrically conductive contact region of the design electrically conductive contact region, wherein the design electrically conductive contact region and the possible electrically conductive contact region are not identical; and
   determining that the design electrically conductive line and the design electrically conductive contact region are potentially defective if an interfacing surface area of the simulated electrically conductive line and the possible electrically conductive contact region is less than a pre-specified value;
   wherein the possible electrically conductive contact region has a minimum linear size in a reference plane that is parallel to the interfacing surface within a linear size tolerance of a fabrication process which will be used to fabricate the design electrically conductive contact region.

2. The method of claim 1, further comprising, if the interfacing surface area is at least the pre-specified value, then repeating said simulating and said determining for one possible electrically conductive contact region after another until (a) the if condition of said determining is satisfied, or (b) said simulating and said determining have been performed for a pre-specified number of possible electrically conductive contact regions, whichever of (a) and (b) comes first.

3. The method of claim 1, further comprising repeating said simulating and said determining for one possible electrically conductive contact region after another until said simulating and said determining have been performed for a pre-specified number of possible electrically conductive contact regions.

4. The method of claim 1, wherein said modeling the simulated electrically conductive line is performed by a computer running a simulation program.

5. The method of claim 1, wherein the pre-specified value is determined based on a design current expected to flow between the design electrically conducting line and the design electrically conductive contact region.

6. The method of claim 5, wherein the pre-specified value is determined based on a maximum allowable current density that can flow between the design electrically conducting line and the design electrically conductive contact region without damaging an electric contact between the design electrically conducting line and the design electrically conductive contact region.

7. The method of claim 1, wherein the possible electrically conductive contact region has a polygon shape in a reference plane that is parallel to the interfacing surface.

8. The method of claim 1, wherein the possible electrically conductive contact region has a circle shape in a reference plane that is parallel to the interfacing surface.

9. The method of claim 1, wherein the possible electrically conductive contact region has a maximum displacement in the reference plane within a displacement tolerance of the fabrication process.

10. The method of claim 1, wherein the possible electrically conductive contact region has a maximum displacement in a reference plane that is parallel to the interfacing surface within a displacement tolerance of a fabrication process which will be used to fabricate the design electrically conductive line and the design electrically conductive contact region.

11. A design verification method, comprising:
    providing in a design a design electrically conductive line and a design electrically conductive contact region being in direct physical contact with the design electrically conductive line;
    modeling a simulated electrically conductive line of the design electrically conductive line;
    simulating M different possible electrically conductive contact regions of the design electrically conductive contact region, M being an integer greater than 1;
    identifying a common region of the M possible electrically conductive contact regions; and
    determining that the design electrically conductive line and the design electrically conductive contact region are potentially defective if an interfacing surface area of the common region and the simulated electrically conductive line is less than a pre-specified value;
    wherein each of the M possible electrically conductive contact regions has a minimum linear size in a reference plane that is parallel to the interfacing surface area within a linear size tolerance of a fabrication process which will be used to fabricate the design electrically conducting line and the design electrically conductive contact region, and
    wherein each of the M possible electrically conductive contact regions has a maximum displacement in the reference plane within a displacement tolerance of the fabrication process.

12. A computer program product, comprising a computer usable medium having a computer readable program code embodied therein, said computer readable program code comprising an algorithm adapted to implement a method for design verification, said method comprising:
    providing in a design a design electrically conductive line and a design electrically conductive contact region being in direct physical contact with the design electrically conductive line;
    modeling a simulated electrically conductive line of the design electrically conductive line;
    simulating a possible electrically conductive contact region of the design electrically conductive contact region, wherein the design electrically conductive contact region and the possible electrically conductive contact region are not identical; and
    determining that the design electrically conductive line and the design electrically conductive contact region are potentially defective if an interfacing surface area of the simulated electrically conductive line and the possible electrically conductive contact region is less than a pre-specified value;
    wherein each of the M possible electrically conductive contact region has a minimum linear size in a reference plane that is parallel to the interfacing surface area within a linear size tolerance of a fabrication process which will be used to fabricate the design electrically conducting line and the design electrically conductive contact region, and wherein each of the M possible electrically conductive contact regions has a maximum displacement in the reference plane within a displacement tolerance of the fabrication process.

13. The computer program product of claim 12, wherein the method further comprising, if the interfacing surface area is at least the pre-specified value, then repeating said simulating and said determining for one electrically conductive contact region after another until (a) the if condition of said determining is satisfied, or (b) said simulating and said determining have been performed for a pre-specified number of possible electrically conductive contact regions, whichever of (a) and (b) comes first.

14. The computer program product of claim 12, the method further comprising re-designing the design electrically conductive line and the design electrically conductive contact region if it is determined from said determining that the design electrically conductive line and the design electrically conductive contact region are potentially defective.

15. The computer program product of claim 12, wherein said modeling the simulated electrically conductive line is performed by a computer running a simulation program.

16. The computer program product of claim 12, wherein the pre-specified value is determined based on a design current expected to flow between the design electrically conductive line and the design electrically conductive contact region.

17. The computer program product of claim 12, wherein the possible electrically conductive contact region has a maximum displacement in a reference plane that is parallel to the interfacing surface within a displacement tolerance of a fabrication process which will be used to fabricate the design electrically conductive line and the design electrically conductive contact region.

\* \* \* \* \*